(12) United States Patent
Tsukuda et al.

(10) Patent No.: US 11,675,005 B2
(45) Date of Patent: Jun. 13, 2023

(54) SEMICONDUCTOR DEVICE AND SCAN TEST METHOD OF THE SAME

(71) Applicant: RENESAS ELECTRONICS CORPORATION, Tokyo (JP)

(72) Inventors: Masayuki Tsukuda, Tokyo (JP); Tomoji Nakamura, Kanagawa (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 283 days.

(21) Appl. No.: 17/102,931

(22) Filed: Nov. 24, 2020

(65) Prior Publication Data
US 2022/0163584 A1    May 26, 2022

(51) Int. Cl.
*G01R 31/3177* (2006.01)
*G01R 31/34* (2020.01)

(52) U.S. Cl.
CPC .............................. *G01R 31/3177* (2013.01)

(58) Field of Classification Search
None
See application file for complete search history.

(56) References Cited

U.S. PATENT DOCUMENTS

| | | | | |
|---|---|---|---|---|
| 5,892,779 A * | 4/1999 | Ohyama | ........ | G01R 31/318569 714/30 |
| 6,381,720 B1 * | 4/2002 | Nakamura | ..... | G01R 31/318558 714/729 |
| 2005/0039095 A1 * | 2/2005 | Guettaf | ................ | H04N 21/426 348/E5.002 |
| 2005/0235184 A1 * | 10/2005 | Yamauchi | ........ | G01R 31/31719 714/726 |
| 2007/0234153 A1 * | 10/2007 | Kawasaki | ...... | G01R 31/318575 714/726 |
| 2009/0083595 A1 | 3/2009 | Kanba | | |
| 2014/0266367 A1 * | 9/2014 | Uesugi | .................. | H03K 3/012 327/208 |

FOREIGN PATENT DOCUMENTS

JP    2009-080037 A    4/2009

* cited by examiner

*Primary Examiner* — Cynthia Britt
*Assistant Examiner* — Dipakkumar B Gandhi
(74) *Attorney, Agent, or Firm* — McDermott Will & Emery LLP (57) ABSTRACT

The semiconductor device includes a transmitting-side hierarchical block, a receiving-side hierarchical block and an inter-block circuit. The transmitting-side hierarchical block includes a first logic circuit and an output control circuit connected to the first logic circuit and controlling an output signal of the transmitting-side hierarchical block. The receiving-side hierarchical block includes a second logic circuit being scan test target and operating by receiving the output signal of the transmitting-side hierarchical block, and a test control circuit controlling the scan test of the second logic circuit. The inter-block circuit transmits the output signal of the transmitting-side hierarchical block to the receiving-side hierarchical block. The test control circuit controls the output control circuit to output a predetermined signal as the output signal of the transmission-side hierarchical block regardless of the output signal of the first logic circuit when the scan test of the second logic circuit is performed.

15 Claims, 8 Drawing Sheets

| | | | SD_T | SD_R | TC |
|---|---|---|---|---|---|
| (1) | BLOCK 2 | TEST | 1 | 1 | 0 |
| | BLOCK 4 | TEST | | | 1 |
| (2) | BLOCK 2 | TEST | 0 | 1 | 0 |
| | BLOCK 4 | NORMAL | | | 1 |
| (3) | BLOCK 2 | NORMAL | 1 | 0 | 0 |
| | BLOCK 4 | TEST | | | 0 |
| (4) | BLOCK 2 | NORMAL | 0 | 0 | 0 |
| | BLOCK 4 | NORMAL | | | 0 |

FIG. 8

SEMICONDUCTOR DEVICE AND SCAN TEST METHOD OF THE SAME

BACKGROUND

The present invention relates to a semiconductor device, and in particular, the present invention can be suitably applied to a semiconductor device having a scan chain.

One of semiconductor device tests is dynamic fault test (dynamic test). A dynamic fault is a fault in which signal propagation does not fall within a predetermined time. If a dynamic fault occurs in a logic circuit, the speed performance of the logic circuit may be reduced, or the logic circuit itself may not operate properly.

The dynamic fault test is performed to detect such dynamic faults. For example, in a dynamic fault test, logic circuits (semiconductor device) are operated at the same or higher operating clock frequency as the actual circuit operation, and the output of the logic circuit to be tested is compared with the expected value. If the operating frequency of the logic circuit at test is equal to the actual operating frequency of the logic circuit, the dynamic fault test may be referred to as a real speed test. Also, the dynamic fault test confirms that the operation delay of the logic circuit at the operating clock frequency is less than or equal to the reference, and is also referred to as a delay test.

The dynamic fault test can be achieved by arranging a scan chain on semiconductor device and performing scan test. The dynamic fault test of a semiconductor device having a large-scale circuit comprising a plurality of hierarchical blocks is performed for each hierarchical block. In this manner, if the dynamic fault test is performed for each hierarchical block, the fault detection of the combinational circuits between the hierarchical blocks may be lost.

Japanese unexamined Patent Application publication No. 2009-80037 (Patent Document 1) discloses a test circuit for a semiconductor device comprising a plurality of divisional circuits. Each divisional circuit of Patent Document 1 has a test circuit comprising a scan chain composed of peripheral scan FFs for transmitting and receiving signals to/from other divisional circuit and a scan chain composed of internal scan FFs. The combinational circuits between divisional circuits receive and process data from peripheral scan FFs of divisional circuits that are not to be tested. The processing result of the combination circuits between the divisional circuits is output to the peripheral scan FFs in the divisional circuit to be tested, and is read out from the scan chain composed of the peripheral scan FFs. The semiconductor device of Patent Document 1 thus detects failure of the combinational circuits between the divisional circuits.

SUMMARY

In semiconductor device of Patent Document 1, in order to detect the faults of the combinational circuits between the divisional circuits, the same clock as the scan FFs provided in the divisional circuit to be tested must be applied to the peripheral scan FFs of the divisional circuit not to be tested. However, when the circuit scale is large, it is difficult to synchronize the clock supplied to the peripheral scan FFs of the divisional circuit not to be tested and the clock supplied to the divisional circuit to be tested.

Other objects and novel features will become apparent from the description of this specification and the accompanying drawings.

According to semiconductor device according to an embodiment, there is provided a transmitting-side hierarchical block including a first logic circuit for realizing a first function, an output control circuit connected to the first logic circuit and generating an output signal of the transmitting side hierarchical block, a second logic circuit for receiving an output signal of the transmitting-side hierarchical block of the scan test and realizing a second function, a receiving-side hierarchical block including a test control circuit for controlling a scan test of the second logic circuit, and an inter-block circuit for transmitting an output signal of the transmitting side hierarchical block to the receiving side hierarchical block. The test control circuit controls the output control circuit so as to output a predetermined signal as an output signal of the transmitting-side hierarchical block regardless of the output signal of the first logic circuit when the scan test of the second logic circuit is performed.

The scan test method of semiconductor device according to another embodiment includes: a first logic circuit that realizes a first function; a transmitting-side hierarchical block that is connected to the first logic circuit and generates an output signal of the transmitting-side hierarchical block; a second logic circuit that receives an output signal of the transmitting-side hierarchical block of the scan test and realizes a second function; a receiving side hierarchical block that includes a test control circuit that controls a scan test of the second logic circuit; and an inter-block circuit that transmits an output signal of the transmitting side hierarchical block to the receiving-side hierarchical block, wherein the output control circuit is controlled to output a predetermined signal according to an instruction of the test control circuit, and performs a scan test of the second logic circuit.

According to the above-described embodiment, it is possible to detect failure of a path between the transmitting-side hierarchical block and the receiving-side hierarchical block including an inter-block circuit by the scan test of the receiving-side hierarchical block without synchronizing the clocks of the transmitting-side hierarchical block and the receiving-side hierarchical block.

DETAILED DESCRIPTION

Hereinafter, a semiconductor device according to an embodiment will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. Also, at least some of the embodiments may be arbitrarily combined with each other.

First Embodiment

Figure 1:
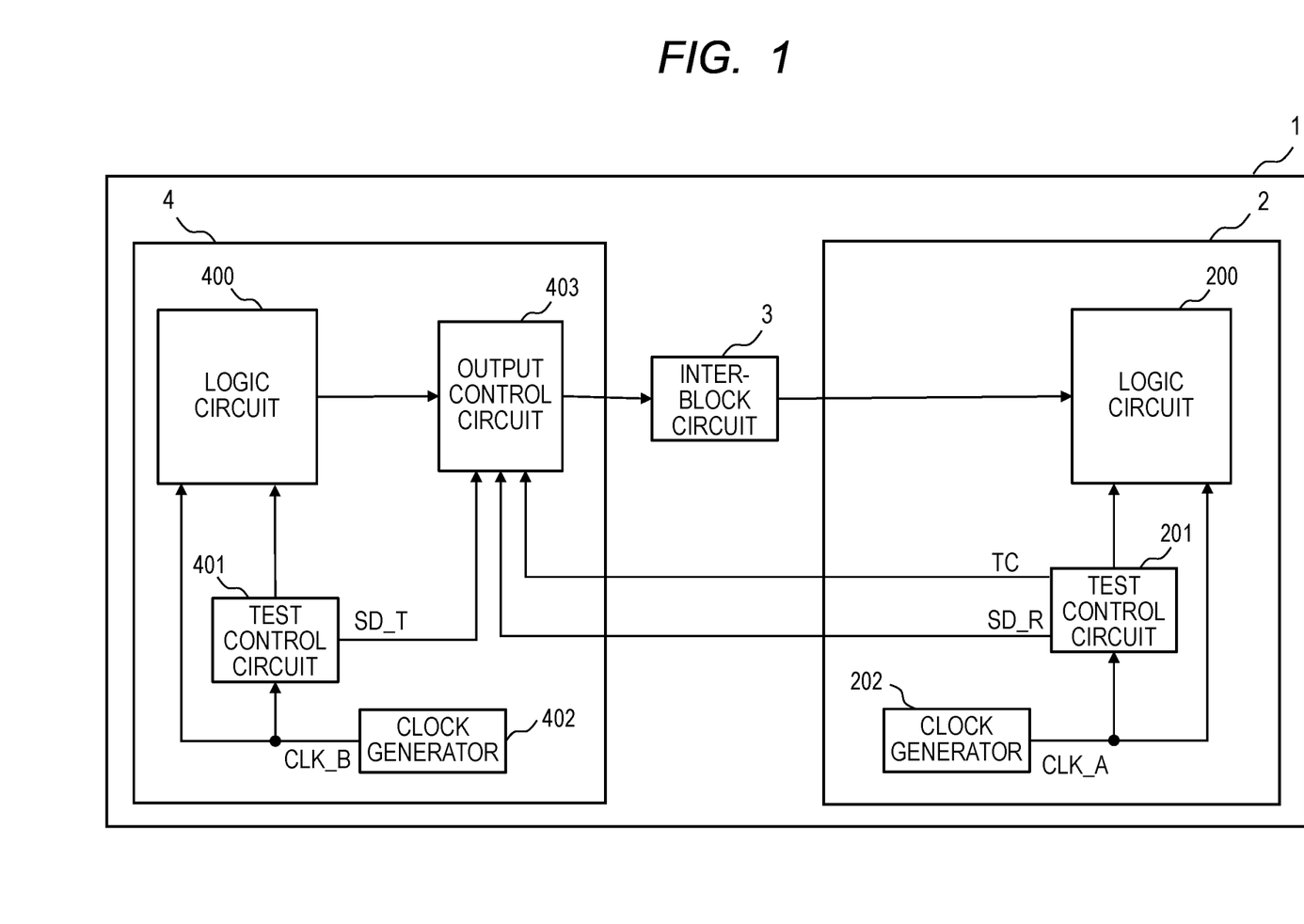
FIG. 1 is a block diagram illustrating an exemplary configuration of semiconductor device according to first embodiment.

FIG. 1 shows a semiconductor device according to first embodiment. The semiconductor device 1 includes a hierarchical block 2, an inter-hierarchical circuit 3 (hereinafter referred to as an inter-block circuit 3), and a hierarchical block 4. The functions of the semiconductor device are achieved by combining a plurality of hierarchical blocks, and the hierarchical block 2 and the hierarchical block 4 are elements for achieving predetermined functions in the semiconductor device 1.

Hereinafter, the present embodiment describes an example in which the output signals of the hierarchical block 4 is input to the hierarchical block 2 through the inter-block circuit 3. That is, the hierarchical block 2 can be regarded as the receiving side hierarchical block, and the hierarchical block 4 can be regarded as the transmitting side hierarchical block.

The hierarchical block 2 includes a logic circuit 200, a test control circuit 201 and a clock generation circuit 202.

The logic circuit 200 (may be referred as second logic circuit) is a circuit for achieving a function (e.g. second function) in the hierarchical block 2. The logic circuit 200 is a circuit to be tested by scan test, and includes a scan chain (not shown) necessary for executing the scan test. The test control circuit 201 controls the scan test of the logic circuit 200. The test control circuit 201 also generates a shut-off signal SD_R and the inter-block circuit test control signal TC. The clock generation circuit 202 generates a clock signal CLK_A to be supplied to the logic circuit 200 and the test control circuit 201. The scan test of the logic circuit 200 is performed using the clock signal CLK_A.

The inter-block circuit 3 is a circuit that transmits at least one of output signals of the hierarchical block 4 to the hierarchical block 2. The inter-block circuit 3 includes, for example, at least one of buffers or at least of even-numbered inverters. Further, the inter-block circuit 3 may be a shut-off circuit for shutting off the control signal and the power supply when the power supply is separated for each hierarchy.

The hierarchical block 4 includes a logic circuit 400, a test control circuit 401, a clock generation circuit 402 and the output control circuit 403.

The logic circuit 400 (may be referred as first logic circuit) is a circuit for realizing a function (e.g. first function) in the hierarchical block 4. The logic circuit 400 is a circuit under test of the scan test, and includes a scan chain (not shown) necessary to execute the scan test. The test control circuit 401 controls the scan test of the logic circuit 400. Further, the test control circuit 401, for performing the scan test of the logic circuit 400, generates a shut-off signal SD_T to output to the output control circuit 403. The clock generation circuit 402 generates a clock signal CLK_B to be supplied to the logic circuit 400 and the test control circuit 401. The scan test of the logic circuit 400 is performed using the clock signal CLK_B. The clock signal CLK_B may be synchronous or asynchronous with the clock signal CLK_A of the hierarchical block 2. The output control circuit 403 controls the output signals of the hierarchical block 4 based on the shut-off signal SD_R generated by the test control circuit 201 in the hierarchical block 2 and the shut-off signal SD_T generated by the test control circuit 401 of the hierarchical block 4.

Figure 2:
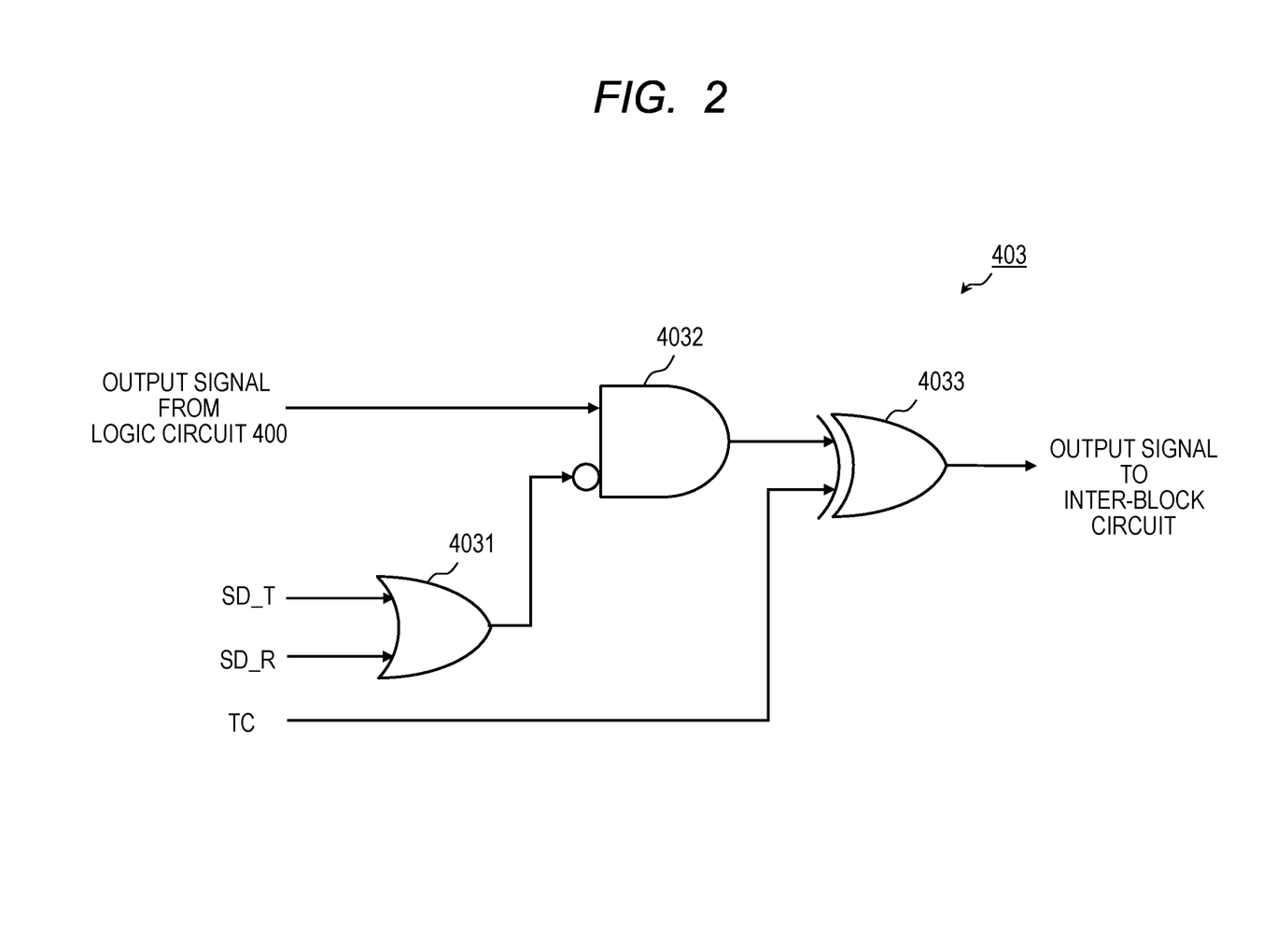
FIG. 2 is a block diagram illustrating an exemplary configuration of the output control circuit according to first embodiment.

FIG. 2 shows an exemplary configuration of the output control circuit 403. The output control circuit 403 includes an OR circuit 4031, an AND circuit 4032 of one side inverting input and an XOR circuit 4033.

The OR circuit 4031 receives the shut-off signal SD_R and the shut-off signal SD_T. The AND circuit 4032 receives the output signal of the OR circuit 4031 and the output signal of the logic circuit 400, and shuts off the output signal of the logic circuit 400 based on an OR of the shut-off signal SD_R and the shut-off signal SD_T. That is, the AND circuit 4032 functions as a shut-off circuit for shutting off the output signal of the logic circuit 400. When the output signal of the logic circuit 400 is interrupted, the XOR circuit 4033 outputs a predetermined signal based on the inter-block circuit test control signal TC. That is, the XOR circuit 4033 functions as an output signal setting circuit for generating a predetermined signal based on the inter-block circuit test control signal TC.

Thus, the output control circuit 403 shuts off the output signal of the logic circuit 400 based on the shut-off signal SD_R and SD_T, and outputs a predetermined signal based on the inter-block circuit test control signal TC during a period for shutting off the output signal of the logic circuit 400. In other words, the output control circuit 403, during the period for shutting off the output signal of the logic circuit 400 based on the shut-off signals SD_R and SD_T, regardless of value of the output signal of the logic circuit 400 outputs the predetermined signal based on the inter-block circuit test control signal TC. Incidentally, the output control circuit 403 is a combination circuit as shown in FIG. 2. The output control circuit 403 may include a plurality of combination circuit. The combination circuits are provided for each output signals of the logic circuit 400. Therefore, the predetermined signal output from the output control circuit 403 is not output in synchronization with any of the clock signals CLK_A and CLK_B. Details of the operation of the output control circuit 403 will be described later.

Operation of Semiconductor Device 1

Figure 3:
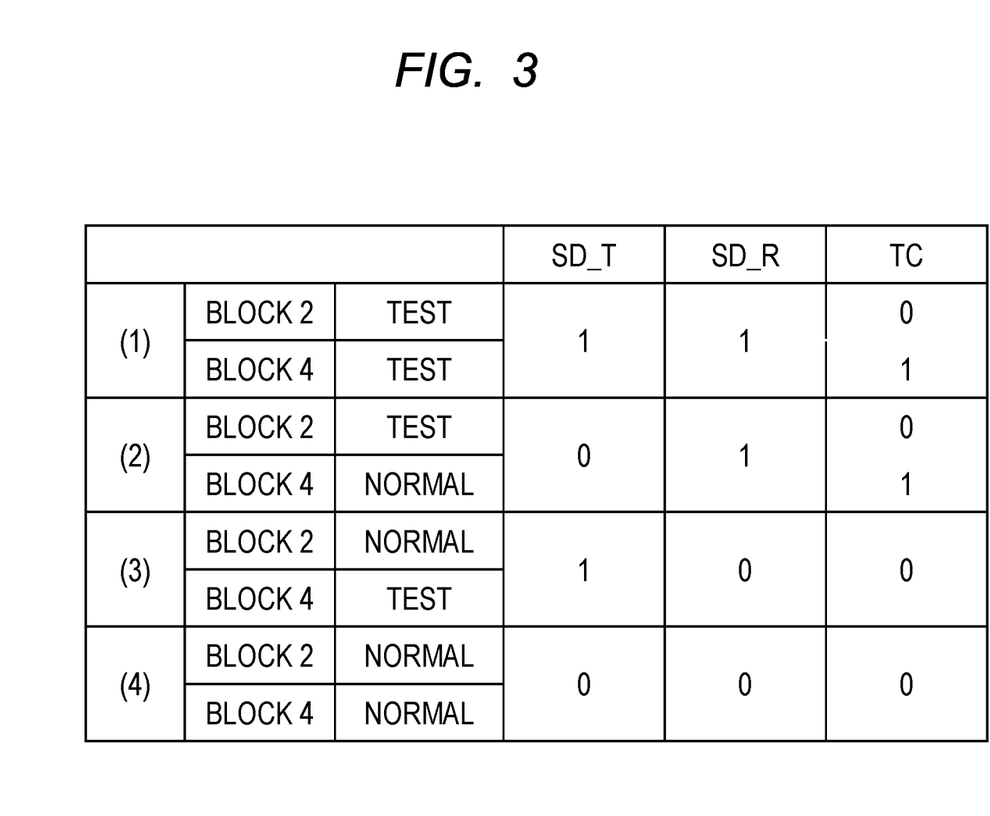
FIG. 3 is a table showing a combination of shut-off signals and an inter-block circuit test control signal in the operation according to first embodiment.

The semiconductor device 1 has first to fourth operation modes. Referring to FIGS. 2 and 3, the respective operation modes of semiconductor device 1 will be described. FIG. 3 shows a combination of the shut-off signal SD_R, the shut-off signal SD_T, and the inter-block circuit test control signal TC in the respective operation modes. The shut-off signal SD_R becomes an active level during the scan test of the hierarchical block 2, and becomes an inactive level during the normal operation. Similarly, the shut-off signal SD_T becomes the active level during the scan test of the hierarchical block 4, and becomes the inactive level during the normal operation. Here, the active level corresponds to, for example, a logic level "1" or an H level, and the inactive level corresponds to, for example, a logic level "0" or an L level. Hereinafter, the active level and the logical level "1" are simply referred to as "1", and the inactive level and the logical level "0" are simply referred to as "0".

First Operation Mode

The first operation mode is a mode in which the scan test of the hierarchical block 2 and the scan test of the hierarchical block 4 are performed simultaneously. The first operation mode is used, for example, to scan test all the hierarchical blocks when semiconductor device 1 is started.

As shown in FIG. 3, the test control circuit 201 of the hierarchical block 2 and the test control circuit 401 of the hierarchical block 4 output a shut-off signal SD_R and a shut-off signal SD_T indicating "1", respectively. The scan test of the logic circuit 200 in the hierarchical block 2 is controlled by the test control circuit 201, and is performed in synchronization with the clock signal CLK_A. The scan test of the logic circuit 400 in the hierarchical block 4 is controlled by the test control circuit 401, and is performed in synchronization with the clock signal CLK_B. That is, the clock signal CLK_A is a scan test clock signal for the logic circuit 200, and the clock signal CLK_B is a scan test clock signal for the logic circuit 400.

Since the shut-off signal SD_R and the shut-off signal SD_T are "1", the AND circuit 4032 of the output control circuit 403 shuts off the output signal of the logic circuit 400. Thus, the signal for the hierarchical block 2 is shut off. Therefore, the scan test of the hierarchical block 2 can be performed without being affected by the output result of the scan test of the hierarchical block 4.

The AND circuit 4032 of the output control circuit 403 outputs "0" while the AND circuit 4032 shuts off the output signal of the logic circuit 400. Therefore, the XOR circuit 4033 outputs a predetermined signal based on the inter-block circuit test control signal TC as an output signal of the hierarchical block 4.

When the inter-block circuit test control signal TC is "1", the output signal of the XOR circuit 4033, that is, the output signal of the output control circuit 403 becomes "1", and is transmitted to the hierarchical block 2 via the inter-block circuit 3 as the output signal of the hierarchical block 4. The output signal of the output control circuit 403 is asynchronous to both the clock signal CLK_A of the hierarchical block 2 and the clock signal CLK_B of the hierarchical block 4. In this state, the scan test of the hierarchical block 2 is performed. In other words, after the output control circuit 403 is controlled to output the output signal based on the inter-block circuit test control signal TC, the scan test of the hierarchical block 2 is performed. In the capture operation of the scan test of the hierarchical block 2, the signal received by the hierarchical block 2 through the inter-block circuit 3 is captured in one of the scan flip-flops (not shown) of the scan chain of the logic circuit 200. Therefore, if there is no failure in the path from the hierarchical block 4 to the hierarchical block 2 including the inter-block circuit 3, in the capture operation of the scan test, the scan flip-flop should capture a signal indicating "1" from the inter-block circuit 3. Thus, by collating the value captured in the scan flip-flop with the expected value, it is possible to detect the stuck-at-0 fault in the path from the hierarchical block 4 to the hierarchical block 2 via the inter-block circuit 3.

On the other hand, when the inter-block circuit test control signal TC is "0", the XOR circuit 4033 outputs "0" as the output signal of the output control circuit 403. The output signal of the output control circuit 403 is transmitted to the hierarchical block 2 via the inter-block circuit 3 as the output signal of the hierarchical block 4. Under this condition, the scan test of the hierarchical block 2 is performed. Therefore, if there is no failure in the path from the hierarchical block 4 to the hierarchical block 2 including the inter-block circuit 3, in the capture operation of the scan test, the scan flip-flop should capture a signal indicating "0" from the inter-block circuit 3. Thus, it is possible to detect the stuck-at-1 fault in the path from the hierarchical block 4 to the hierarchical block 2 including the inter-block circuit 3 by collating the value captured in the scan flip-flop with the expected value.

Second Operation Mode

The second operation mode is an operation mode in which the scan test of the hierarchical block 2 and the normal operation of the hierarchical block 4 are performed, respectively. The second operation mode is used, for example, when performing scan test for some hierarchical blocks during normal operation of semiconductor device 1.

As shown in FIG. 3, the test control circuit 201 of the hierarchical block 2 generates the shut-off signal SD_R which becomes "1", and the test control circuit 401 of the hierarchical block 4 generates the shut-off signal SD_T which becomes "0". The shut-off signal SD_R and the shut-off signal SD_T are supplied to the output control circuit 403 of the hierarchical block 4. Since the OR circuit 4031 of the output control circuit 403 receives the shut-off signal SD_R which is "1", the AND circuit 4032 shuts off the output signal of the logic circuit 400. Therefore, the scan test of the hierarchical block 2 can be performed without being affected by output from the hierarchical block 4 operating in the normal operation. Thus, it is possible to perform scan-test for some of the hierarchical blocks in semiconductor device 1.

Similar to the first operation mode, the output control circuit 403 outputs the predetermined signal based on the inter-block circuit test control signal TC, and supplies the predetermined signal to the inter-block circuit 3. The scan test of the hierarchical block 2 is performed under such condition that the predetermined signal output from the output control circuit 403 is supplied through the inter-block circuit 3 to the hierarchical block 2. Therefore, even when the hierarchical block 4 is in the normal operation, failure of path from the hierarchical block 4 to the hierarchical block 2 including the inter-block circuit 3 can be detected by the scan test of the hierarchical block 2, as in the first operation mode.

Third Operation Mode

The third operation mode is a mode in which the normal operation of the hierarchical block 2 and a scan test of the hierarchical block 4 are performed. Third operation mode is also used when a scan test of a part of the hierarchical blocks is performed during the normal operation of semiconductor device 1, similarly to the second operation mode.

Since the hierarchical block 2 performs normal operation, the test control circuit 201 sets the shut-off signal SD_R and the inter-block circuit test control signal TC to "0". On the other hand, the test control circuit 401 of the hierarchical block 4 in which the scan test is performed outputs the shut-off signal SD_T which becomes "1". Therefore, the output of the logic circuit 400 is shut off, the output of the output control circuit 403 is fixed to "0". That is, the output of the logic circuit 400 by the scan test of the hierarchical block 4 is not output to the outside of the logic circuit 400, and thus, the output of the logic circuit 400 by the scan test of the hierarchical block 4 does not affect the normal operation of the hierarchical block 2.

Fourth Operation Mode

The fourth operation mode is a mode in which both the hierarchical block 2 and the hierarchical block 4 perform normal operation. Therefore, the test control circuit 201 of the hierarchical block 2 sets both the shut-off signal SD_R and the inter-block circuit test control signal TC to "0". The test control circuit 401 of the hierarchical block 4 sets the shut-off signal SD_T to "0". Therefore, the output control circuit 403 of the hierarchical block 4 passes the output of the logic circuit 400 and outputs the output of the logic circuit 400 to the inter-block circuit 3. The logic circuit 200 of the hierarchical block 2 receives the output of the logic circuit 400 through the inter-block circuit 3 and performs normal operation.

As described above, according to present embodiment, the hierarchical block 4 has the output control circuit 403 that shuts off the output signal of the logic circuit 400 and outputs the predetermined signal as the output signal of the hierarchical block 4 according to the instruction from the test control circuit 201 of the hierarchical block 2. Therefore, the scan test of the hierarchical block 2 can be performed in a state in which the hierarchical block 2 receives the predetermined signal output from the hierarchical block 4 through the inter-block circuit 3. Therefore, it is unnecessary to operate the hierarchical block 4 in synchronization with the clock of the hierarchical block 2 in order to detect the failure of the inter-block circuit 3 by the scan test of the hierarchical block 2 which is the receiving side hierarchical block. As a result, even if the circuit scale becomes larger and it becomes difficult to synchronize the clocks between the hierarchical blocks, it is possible to detect the failure of the inter-block circuit by the scan test of the receiving side hierarchical block.

Further, according to the present embodiment, when the scan test of the hierarchical block 2 or the hierarchical block 4 is performed, the output from the hierarchical block 4 which is the transmitting side hierarchical block to the hierarchical block 2 which is the receiving side hierarchical block is controlled. This prevents the receiving side hierarchical block from being affected by the output of the logic circuit in the transmitting side hierarchical block during the scan test. Therefore, the hierarchical block 2 and the hierarchical block 4 can individually execute the scan test without being affected by the operation of the logic circuits of each other.

Generally, it is required to reduce test time for semiconductor device and to improve failure detection rate. In order to realize them, it is necessary to improve the operating rate of the circuit. However, increasing the operating rate has the disadvantage of increasing the operating power. However, according to present embodiment, since the tests of the hierarchical block 2 and the hierarchical block 4 can be performed asynchronously, even if the scan tests are performed simultaneously, the number of circuits that operate simultaneously can be reduced by shifting the operation clocks. Therefore, according to present embodiment, while suppressing the operating power, it is possible to reduce the test time by improving the operating rate and improve the failure detection rate.

Second Embodiment

Figure 4:
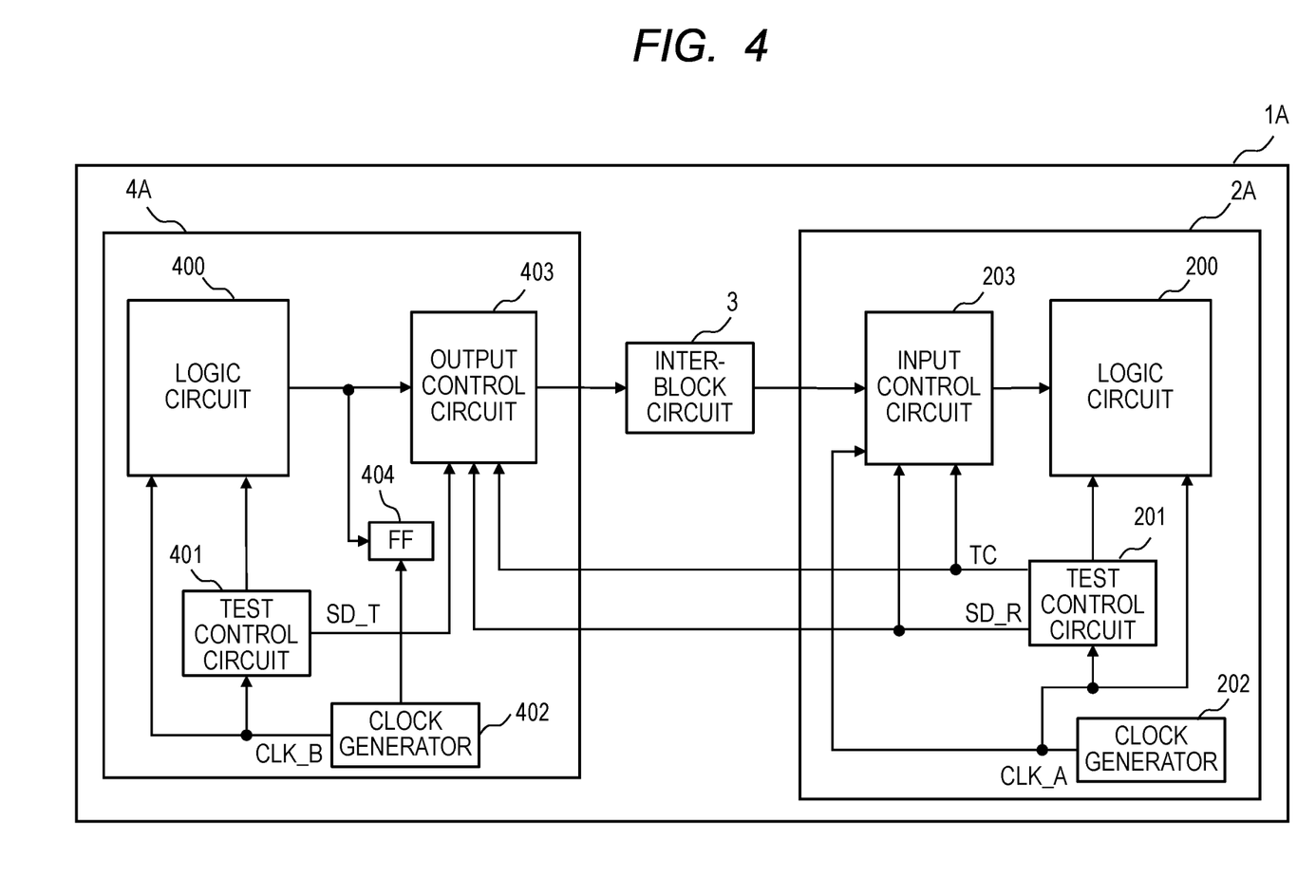
FIG. 4 is a block diagram showing an exemplary configuration of a semiconductor device according to second embodiment.

Next, second embodiment will be described. FIG. 4 shows a semiconductor device according to second embodiment. Semiconductor device 1A has hierarchical blocks 2A and 4A which are another form of hierarchical blocks 2 and 4 according to first embodiment. The hierarchical block 2A differs from the hierarchical block 2 described in first embodiment in that it further includes an input control circuit 203. The hierarchical block 4A differs from the hierarchical block 4 described in first embodiment in that it further includes at least one observation flip-flop (FF) 404. Other configurations and operations are the same as those of semiconductor device 1 described in first embodiment, and therefore, the same components are denoted by the same reference numerals, and duplicate descriptions are omitted.

The hierarchical block 2A is a receiving side hierarchical block in the same way as the hierarchical block 2 of first embodiment, and the hierarchical block 4A is a transmitting side hierarchical block in the same way as the hierarchical block 4 of first embodiment. The output of the hierarchical block 4A is supplied to the hierarchical block 2A via the inter-block circuit 3.

Unlike the hierarchical block 2, the hierarchical block 2A includes an input control circuit 203 that controls input signals to the logical circuit 200 during scan test of the hierarchical block 2A. The input control circuit 203 receives at least one signal input to the hierarchical block 2A via the inter-block circuit 3 and controls the input for the logic circuit 200 in accordance with the shut-off signal SD_R and the inter-block circuit test control signal TC.

Figure 5:
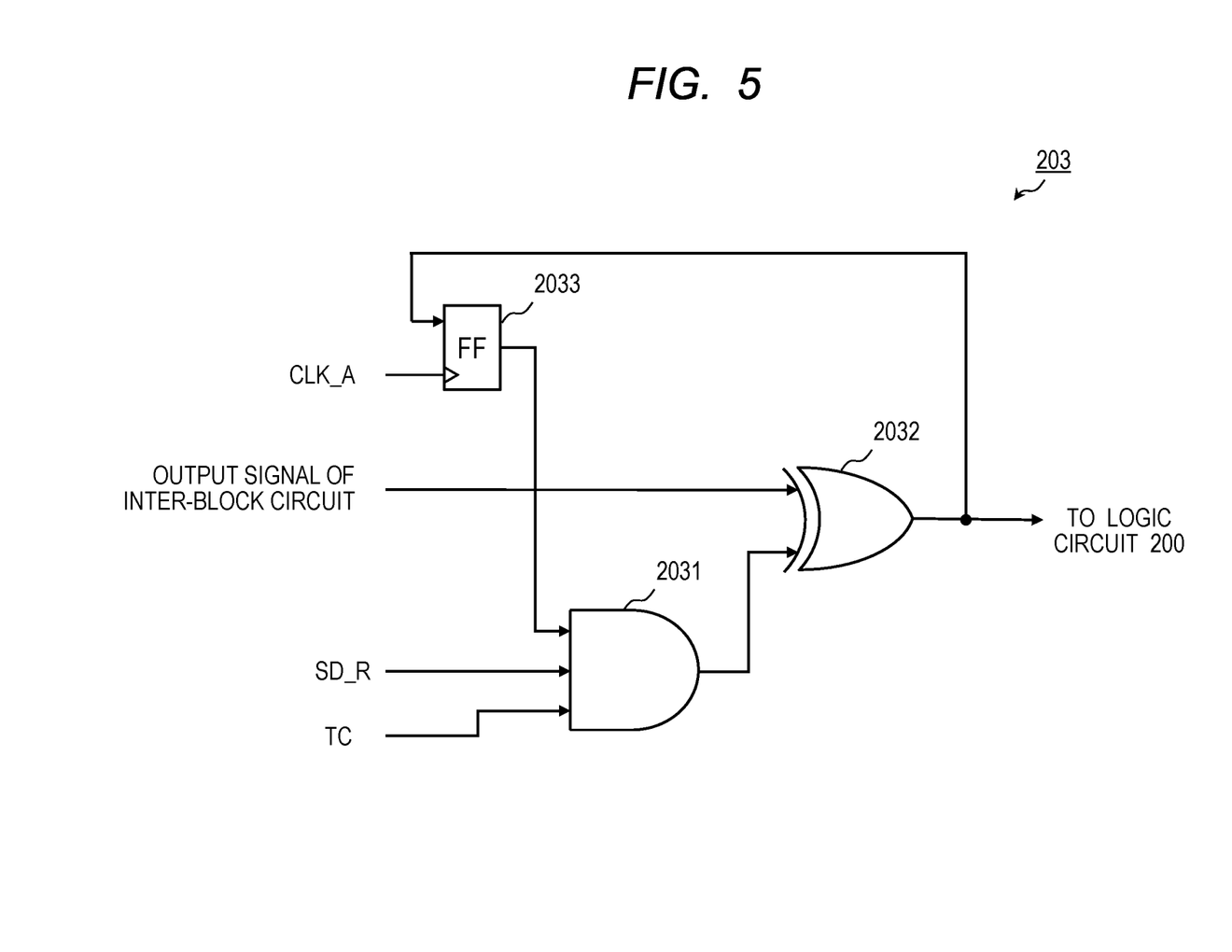
FIG. 5 is a block diagram showing an exemplary configuration of an input control circuit according to second embodiment.

FIG. 5 shows a configuration example of the input control circuit 203. The input control circuit 203 includes an AND circuit 2031, an XOR circuit 2032 and a control flip-flop (FF) 2033.

The AND circuit 2031 receives the shut-off signal SD_R, the output of the inter-block circuit test control signal TC and the control FF 2033. The XOR circuit 2032 receives the output signal of the inter-block circuit 3 and the logical product of three signals including the shut-off signal SD_R, the output of the inter-block circuit test control signal TC and the control FF 2033. The control FF 2033 receives the output signal of the XOR circuit 2032, in synchronization with the clock signal CLK_A from the clock generation circuit 201, and outputs the signal received from the XOR circuit 2032 to the AND circuit 2031. With this configuration, when the hierarchical block 2 and the hierarchical block 4 are both in normal operation, the input control circuit 203 receives the output signal from the logic circuit 400 of the hierarchical block 4 transmitted through the inter-block circuit 3 and supplies the received signal to the logic circuit 200. Further, during the scan test of the hierarchical block 2, the input control circuit 203 supplies a signal synchronized with the clock signal used for the scan test of the logic circuit 200 in accordance with the inter-block circuit test control signal TC. The detailed operation of the input control circuit 203 will be described later.

Returning to FIG. 4, the observation flip-flop (FF) 404 will be described. The observation FF 404, in synchronization with the clock signal CLK_B generated by the clock generation circuit 402, captures the output signal from the logic circuit 400. The output signal from the logic circuit 400 taken into the observation FF 404 is output to the outside and is collated with the expected value. Thus, the output result of the logic circuit 400 can be confirmed.

Operation of Semiconductor Device 1A

Next, the operation of semiconductor device 1A will be described. The combination of the shut-off signal SD_R, the shut-off signal SD_T, and the inter-layer circuit test control signal TC in the respective operation modes is the same as the combination shown in FIG. 3 described with reference to first embodiment.

First Operation Mode

The first operation mode is a mode in which scan tests of hierarchical block 2A and hierarchical block 4A are performed simultaneously. As shown in FIG. 3, the shut-off signal SD_R and the shut-off signal SD_T are both set to "1".

The output control circuit 403, similarly to first embodiment, shuts off the output signal of the logic circuit 400 based on the shut-off signal SD_R and the shut-off signal SD_T. Therefore, the hierarchical block 2A performs scan test without being affected by the output from the hierarchical block 4A. Further, the input control circuit 203 and the output control circuit 403 are controlled based on the inter-block circuit test control signal TC.

First, a case where the inter-block circuit test control signal TC is "0" will be described.

Similar to first embodiment, the output control circuit 403 outputs a signal to be "0" in response to the inter-block circuit test control signal TC. The output signal of the output control circuit 403 is transmitted to the hierarchical block 2A via the inter-block circuit 3 as the output signal of the hierarchical block 4A.

The input control circuit 203 transmits the output signal of the inter-block circuit 3 to the logic circuit 200. Specifically, in the input control circuit 203 shown in FIG. 5, the AND circuit 2031 receives the inter-block circuit test control signal TC as the shut-off signal SD_R and 0 to become 1 from the test control circuit 201. Therefore, the output signal of the AND circuit 2031 becomes "0", the XOR circuit 2032 transmits the output signal of the inter-block circuit 3 to the logic circuit 200 as it is. At this time, since the output signal of the hierarchical block 4A supplied to the hierarchical block 2A via the inter-block circuit 3 is "0", a signal to be "0" is output from the XOR circuit 2032 to the logic circuit 200 and the control FF 2033. The control FF 2033 operates in synchronization with the clock signal CLK_A, and supplies the signal ("0") received from the XOR circuit 2032 to the AND circuit 2031. However, since the inter-block circuit test control signal TC is 0, the output of the AND circuit 2031 does not change from 0.

Under this condition, the scan test of the hierarchical block 2A is performed. During the capture operation period in the scan test of the hierarchical block 2A, the output signal of the input control circuit 203, that is, the output signal of the hierarchical block 4A, is captured in one of scan flip-flops (not shown) of the scan chain of the logic circuit 200. Therefore, if there is no failure in the path from the hierarchical block 4A to the hierarchical block 2A including the inter-block circuit 3, the scan flip-flop should capture "0". Thus, the stuck-at-1 fault in the path from the hierarchical block 4 to the hierarchical block 2 is detected by collating the value captured by the scan flip-flop with the expected value.

Next, a case where the inter-block circuit test control signal TC is "1" will be described.

When the inter-block circuit test control signal TC is "1", the output signal of the output control circuit 403 is fixed to "1". The output signal of the output control circuit 403 fixed to "1" is supplied to the input control circuit 203 of the hierarchical block 2A via the inter-block circuit 3 as the output signal of the hierarchical block 4A.

Specifically, the output signal ("1") of the hierarchical block 4A supplied via the inter-block circuit 3 is input to the XOR circuit 2032 of the input control circuit 203 shown in FIG. 5. Therefore, the XOR circuit 2032 inverts and outputs the output signal of the AND circuit 2031. For example, when the output signal of the AND circuit 2031 is "0", the XOR circuit 2032 outputs "1". The output signal of the XOR circuit 2032 is provided to the logic circuit 200 and the control FF 2033. The control FF 2033, in synchronization with the clock signal CLK_A, outputs the signal ("1") received from the XOR circuit 2032 to the AND circuit 2031. Since the shut-off signal SD_R and the inter-block circuit test control signal TC is both "1", AND circuit 2031 outputs a signal to be "1". Thus, the output signal of the XOR circuit 2032 changes from "1" to "0". By repeating such an operation, the input control circuit 203 outputs a signal to be toggled in synchronization with the clock signal CLK_A is a scan test clock signal to the logic circuit 200.

During the capture operation period in the scan test of the hierarchical block 2A, the output signal of the input control circuit 203 which performs toggle operation based on the output signal of the hierarchical block 4A is input to the logic circuit 200. The signal input to the logic circuit 200 is taken into one of scan flip-flops of the scan chain of the logic circuit 200. Then, a failure is detected by collating the acquired value with the expected value. Thus, by the input control circuit 203 performing the toggle operation based on the output signal of the hierarchical block 4A, it is possible to detect the stuck-at-0 fault in the path from the hierarchical block 4A to the hierarchical block 2A and the failure of the input terminal portion of the logic circuit 200 from the input control circuit 203.

Further, the observation FF 404 of the hierarchical block 4A captures the output signal of the logic circuit 400 during the capture operation in the scan test of the hierarchical block 4A. By outputting the output signal of the logic circuit 400 taken into the observation FF 404 to the outside, it is possible to confirm the output signal in the scan test of the hierarchical block 4A.

Second Operation Mode

The second operation mode is an operation mode in which the scan test of the hierarchical block 2A is performed and the normal operation of hierarchical block 4A is performed. As shown in FIG. 3, the shut-off signal SD_R is set to "1" and the shut-off signal SD_T is set to "0".

During the scan test of the hierarchical block 2A, in accordance with the shut-off signal SD_R output by the test control circuit 201 of the hierarchical block 2A, the output control circuit 403 of the hierarchical block 4A shuts off the output signal of the logic circuit 400 and outputs the predetermined signal. The following operation is the same as the operation of the hierarchical blocks 2A in the first operation mode in second embodiment, and therefore a description thereof is omitted.

As described above, even when the hierarchical blocks 4A are in the normal operation, the path failure including the inter-block circuit 3 can be detected in the same manner as in the first operation mode.

Third Operation Mode

The third operation mode is an operation mode in which the hierarchical block 2A performs a normal operation and the hierarchical block 4A performs scan test. As shown in FIG. 3, the shut-off signal SD_R is set to "0" and the shut-off signal SD_T is set to "1".

During the scan test of the hierarchical block 4A, the output control circuit 403 of the hierarchical block 4A shuts off the output signal of the logic circuit 400 and outputs the predetermined signal. Therefore, the output signal by the scan test of the hierarchical block 4A is not transmitted to the hierarchical block 2A which performs the normal operation.

On the other hand, since both the shut-off signal SD_R and the inter-block circuit test control signal TC are "0", the input control circuit 203 of the hierarchical block 2A supplies the predetermined signal output from the output control circuit 403 of the hierarchical block 4A to the logic circuit 200. The logic circuit 200 performs a normal operation in a condition in which it receives the predetermined signal.

Fourth Operation Mode

In the fourth operation mode, both the hierarchical block 2A and the hierarchical block 4A perform the normal operation. As shown in FIG. 3, the shut-off signal SD_R and the shut-off signal SD_T are both set to "0".

Therefore, the output control circuit 403 of the hierarchical block 4A transmits the output signal of the logic circuit 400 as the output signal of the hierarchical block 4A to the inter-block circuit 3. The input control circuit 203 of the hierarchical block 2A receives the output signal of the hierarchical block 4A through the inter-block circuit 3 and transmits the output signal to the logic circuit 200. The logic circuit 200 receives the output signal of the hierarchical block 4A input via the input control circuit 203, performs normal operation.

As described above, according to second embodiment, the hierarchical block 2A further includes the input control circuit 203 as compared to the hierarchical block 4 of first embodiment. The input control circuit 203 performs a toggle operation in synchronization with the clock signal CLK_A supplied to the logic circuit 200 that is the circuit to be tested in the scan test of the hierarchical block 2A. Therefore, the failures of the input portion of the input control circuit 203 and the logic circuit 200 can be detected by the scan test of the hierarchical block 2A. Further, the input control circuit 203 performs the toggle operation based on the output signal of the hierarchical block 4A that is the transmitting side hierarchical block. Therefore, the path failure between the hierarchical block 4A and the hierarchical block 2A can also be detected.

Therefore, according to second embodiment, even if the transmitting side hierarchical block (hierarchical block 4A) and the receiving side hierarchical block (hierarchical block 2A) are asynchronous, faults between the transmitting side hierarchical block and the receiving side hierarchical block can be detected by the scan test of the receiving side hierarchical block (hierarchical block 2A).

Third Embodiment

Figure 6:
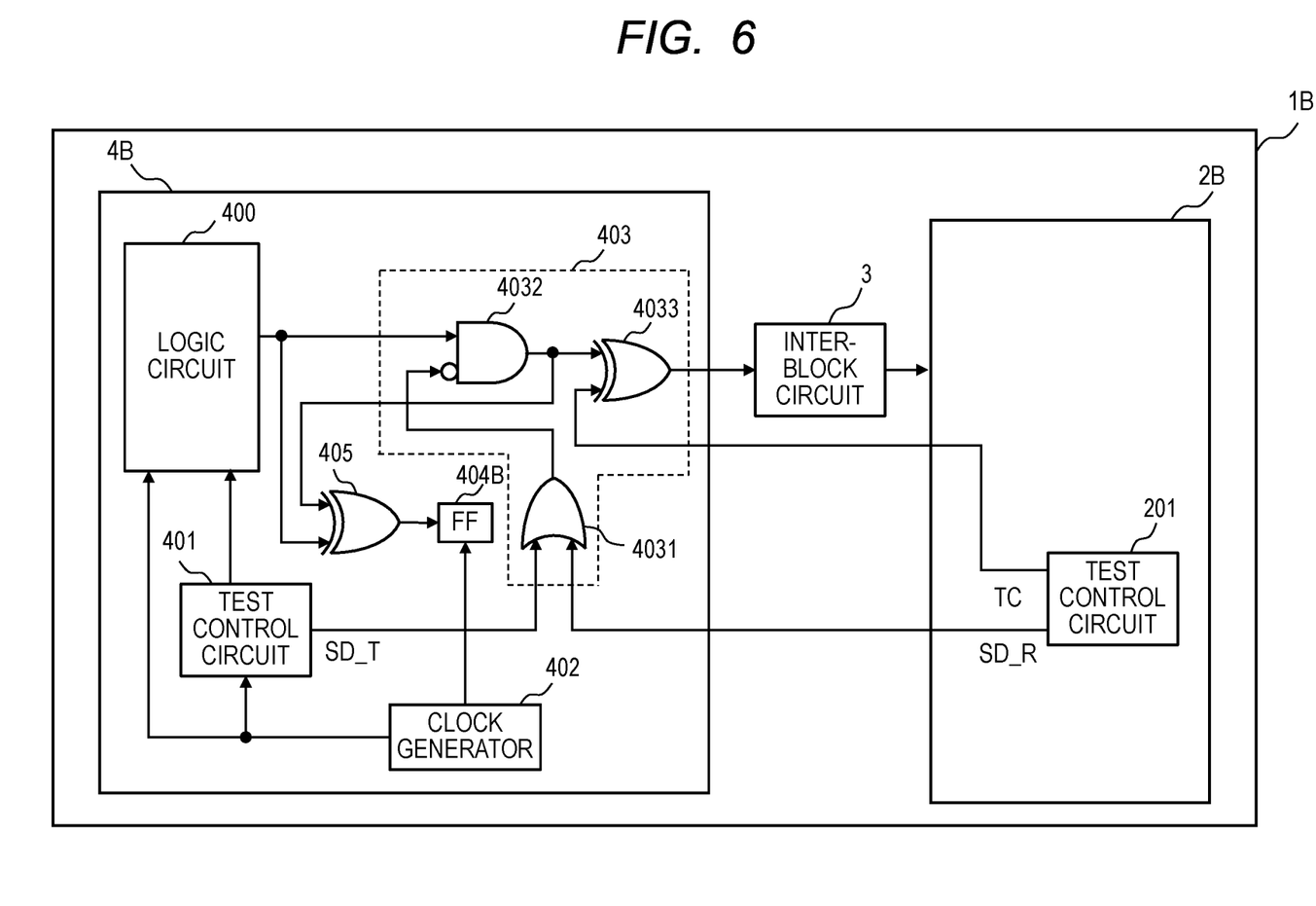
FIG. 6 is a block diagram illustrating an exemplary configuration of semiconductor device according to third embodiment.

Next, third embodiment will be described. FIG. 6 shows a semiconductor device according to third embodiment. The semiconductor device 1B includes a hierarchical block 2B and a hierarchical block 4B. Since the structure of the hierarchical block 2B may be the same as that of the hierarchical block 2 of first embodiment or the hierarchical block 2A of second embodiment, and a repetitive descriptions thereof are omitted. In FIG. 6, only the test control circuit 201, which is one of the components of the hierarchical blocks 2B, is shown. The hierarchical block 4B differs in that it further includes an observation flip-flop (FF) 404B and an XOR circuit 405 as compared to the hierarchical block 4 described in first embodiment. The configuration and operation of the other hierarchical block 4B are the same as those of the hierarchical block 4 described in first embodiment, so the same reference numerals will be used for the same configurations, and a repetitive descriptions thereof are omitted.

The XOR circuit 405 receives the output signal of the logic circuit 400 and the output signal of the one-side inverting input AND circuit 4032 in the output control circuit 403. The observation FF 404B captures the output of the XOR circuit 405 in synchronization with the clock signal CLK_B of the clock generation circuit 402 of the hierarchical block 4B.

As described above, when the AND circuit 4032 based on the shut-off signal SD_R or SD_T shuts off the output signal of the logic circuit 400, the output of the AND circuit 4032 becomes "0". Thus, the XOR circuit 405 provides the output signal of the logic circuit 400 to the observation FF 404B. By comparing the value captured in the observation FF 404B with the expected value of the output signal of the logic circuit 400, it is possible to detect whether the AND circuit 4032 is correctly shutting off the output signal of the logic circuit 400. That is, the AND circuit 4032 is outputting "0", i.e., stuck-at-1 fault of the AND circuit 4032 can be detected. Thus, the XOR circuit 405 is also regarded as a circuit for determining shut-off function.

According to third embodiment, the hierarchical block 4B can observe the output signal of the logic circuit 400 shut off by the observation FF 404B, if the output shut-off function of the output control circuit 403 is functioning correctly. That is, by observing the output signal of the observation FF 404B, it is possible to detect whether the output shut-off function of the output control circuit 403 is functioning correctly.

Fourth Embodiment

Figure 7:
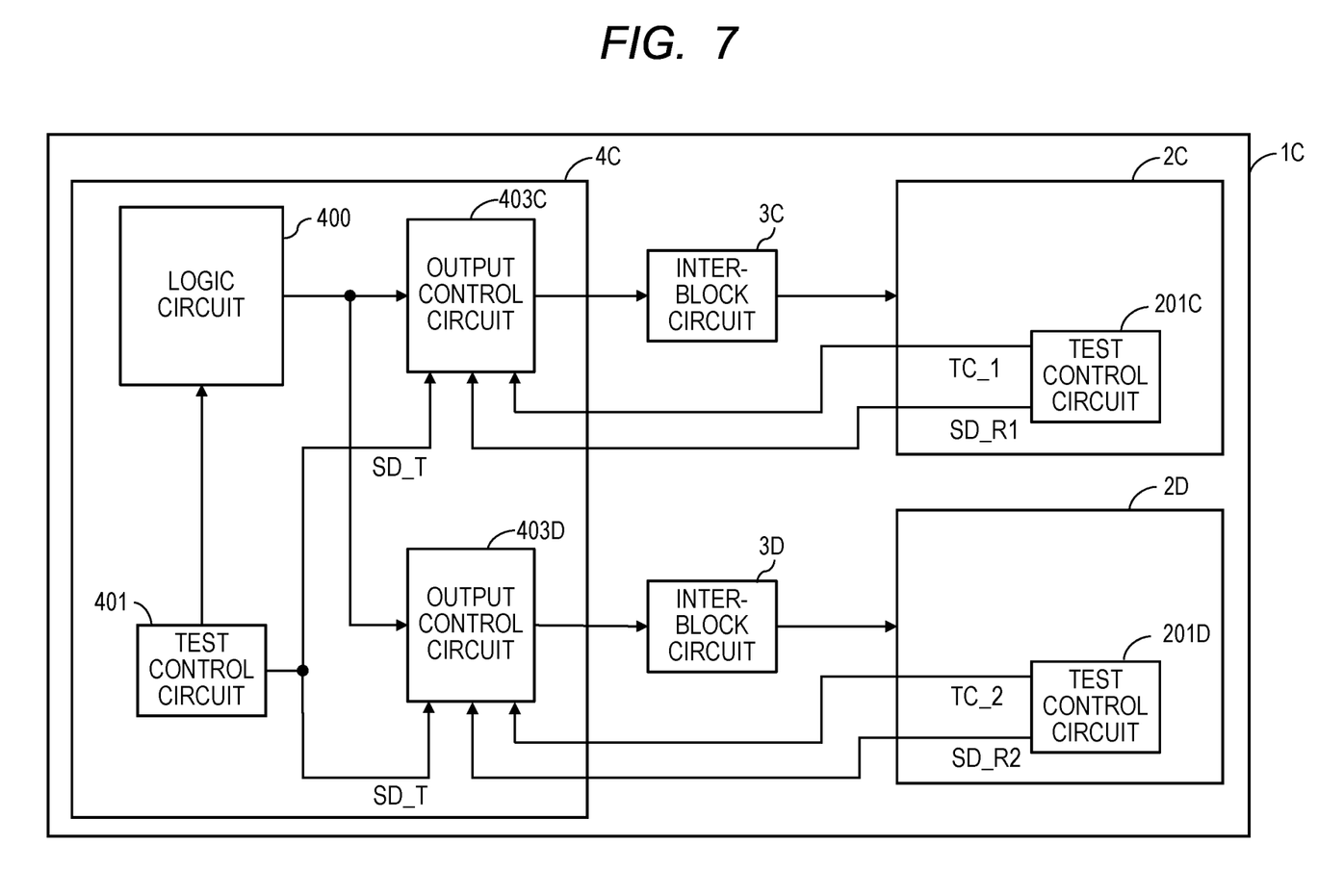
FIG. 7 is a block diagram illustrating an exemplary configuration of semiconductor device according to fourth embodiment.

The fourth embodiment will be described. The fourth embodiment describes a case in which a transmitting-side hierarchical block is connected to a plurality of receiving-side hierarchical blocks. FIG. 7 shows a semiconductor device according to fourth embodiment. The semiconductor device 1C has hierarchical blocks 2C and 2D, which are receiving-side hierarchical blocks, and a hierarchical block 4C, which is a transmitting-side hierarchical block. The hierarchical blocks 2C and 2D receive the output-signals of the hierarchical block 4C via the inter-block circuits 3C and 3D, respectively.

The structure of the hierarchical block 2C and 2D may be the same as that of the hierarchical block 2 of first embodiment, or may be the same as that of the hierarchical block 2A of second embodiment. In FIG. 7, only test control circuits 201C and 201D, which are test control circuits for controlling scan test of logic circuits (not shown) included in the hierarchical blocks, are shown.

Next, the hierarchical block 4C that is a transmission-side hierarchical block in present embodiment will be described. The difference from the hierarchical block 4 of first embodiment shown in FIG. 1 is that it includes a plurality of output control circuits. Since other components are the same as the hierarchical block 4 shown in FIG. 1, the same reference numerals are given to the same components, and a repetitive description thereof are omitted.

The hierarchical block 4C includes an output control circuit 403C corresponding to the hierarchical block 2C and an output control circuit 403D corresponding to the hierarchical block 2D. The output signals from the output control circuit 403C are supplied to the hierarchical block 2C via the inter-block circuit 3C. The output signals from the output control circuit 403D are supplied to the hierarchical block 2D via the inter-block circuit 3D.

The configuration of each of the output control circuits 403C and 403D may be the same as that of the output control circuit 403 shown in FIG. 2. The output control circuit 403C shuts off transmission of the output signal of the logic circuit 400 to the inter-block circuit 3C based on the shut-off signal SD_T from the test control circuit 401 and the shut-off signal SD_R1 from the test control circuit 201C of the hierarchical block 2C. That is, when the corresponding hierarchical block 2C or hierarchical block 4C performs scan test, the output control circuit 403C shuts off transmission of the output signals of the logic circuit 400 to the inter-block circuit 3C. Therefore, whatever values are outputted by the logic circuits 400 of the hierarchical block 4C, the hierarchical block 2C during the scan test is not affected. Further, whatever values are outputted by the logic circuit 400 in the scan test of the hierarchical block 4C do not affect the hierarchical block 2D. When the signal transmission from the logic circuit 400 to the inter-block circuit 3C is interrupted, the output control circuit 403C supplies a predetermined signal to the inter-block circuit 3C based on the inter-block circuit test control signal TC_1 from the test control circuit 201C. On the other hand, when both the hierarchical block 2C and the hierarchical block 4 perform the normal operation, the output control circuit 403C directly supplies the output signals of the logic circuit 400 to the inter-block circuit 3C.

Similarly, the output control circuit 403D shuts off the transmission of the output signal of the logic circuit 400 to the inter-block circuit 3D based on the shut-off signal SD_T from the test control circuit 401 and the shut-off signal SD_R2 from the test control circuit 201D of the hierarchical block 2D. Therefore, whatever values are outputted by the logic circuit 400 of the hierarchical block 4, the hierarchical block 2D during the scan test is not affected. Further, any values outputted by the logic circuit 400 in the scan test of the hierarchical block 4C do not affect the hierarchical block 2D. When the transmission of the output signal of the logic circuit 400 to the inter-block circuit 3D is interrupted, the output control circuit 203D supplies a predetermined signal to the inter-block circuit 3D based on the inter-block circuit test control signal TC_2 from the test control circuit 201D. On the other hand, when both the hierarchical block 2D and the hierarchical block 400 perform the normal operation, the output control circuit 403D directly supplies the output signal of the logic circuit 400 to the inter-block circuit 3D.

In this manner, at the time of scan test, the hierarchical blocks 2C and 2D control the corresponding output control circuits 403C and 403D in the hierarchical block 4C (as the transmitting-side hierarchical block), respectively, and receive predetermined signals through the inter-block circuits 3C and 3D. Each of the hierarchical block 2C and 2D performs scan test while receiving the predetermined signal output from the corresponding output control circuit. Therefore, by collating the values captured in the scan flip-flops of the hierarchical blocks 2C and 2D with the expected values, it is possible to detect a stuck-at fault in the path from the hierarchical block 4C to the hierarchical block 2C including the inter-block circuit 3C and a stuck-at fault in the path from the hierarchical block 4C to the hierarchical block 2D including the inter-block circuit 3D.

Therefore, even when a transmitting-side hierarchical block is connected to a plurality of receiving-side hierarchical blocks, by providing an output control circuit corresponding to the receiving-side hierarchical block in the transmitting-side hierarchical block, it is possible to detect a path failure including each inter-block circuit in the scan test of the receiving-side hierarchical block without synchronizing the clocks of the transmitting-side hierarchical block and the receiving-side hierarchical block.

Fifth Embodiment

Figure 8:
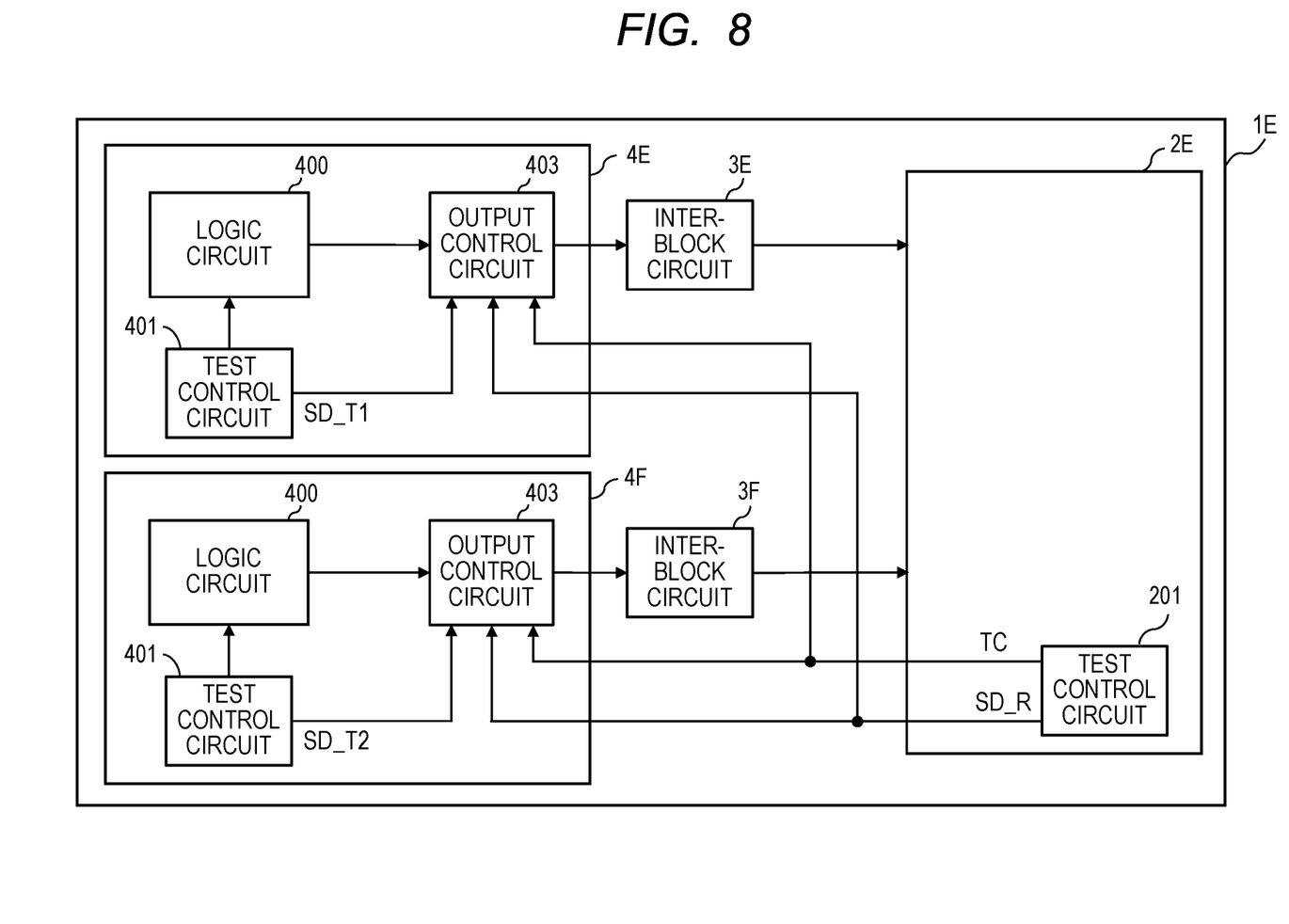
FIG. 8 is a block diagram illustrating an exemplary configuration of semiconductor device according to fifth embodiment.

The fifth embodiment will be described. The fifth embodiment describes a situation in which a plurality of transmitting-side hierarchical blocks are connected to the same receiving-side hierarchical block. FIG. 8 shows a semiconductor device according to fifth embodiment. The semiconductor device 1D includes a hierarchical block 2E, which is a receiving-side hierarchical block, and hierarchical blocks 4E and 4F, which are transmitting-side hierarchical blocks. The hierarchical block 2E receives the output signals of the hierarchical blocks 4E and 4F via the inter-block circuits 3E and 3F.

The configuration of the hierarchical block 2E may be the same as the configuration of the hierarchical block 2 of first embodiment or may be the same as the configuration of the hierarchical block 2A of second embodiment. In FIG. 8, only the test control circuit 201 for controlling the scan test for the logic circuit (not shown) included in the hierarchical block 2E is shown.

Next, the hierarchical block 4E and 4F that are transmission-side hierarchical blocks in present embodiment will be described. The configuration and operation of the hierarchical blocks 4E and 4F are the same as those of the hierarchical block 4 in first embodiment. The output control circuits 403 of the hierarchical blocks 4E and 4F receive the shut-off signal SD_R and the inter-block circuit test control signal TC from the hierarchical block 2E, respectively. Therefore, when the hierarchical block 2E performs scan test, the output signal of the logic circuit (not shown) of the hierarchical block 4E and the output signal of the logic circuit (not shown) of the hierarchical block 4F are shut off, predetermined signals are output from the hierarchical blocks 4E and 4F, and are supplied to the inter-block circuit 3E and 3F. By performing the scan test of the hierarchical block 2E in this condition, faults including stuck-at faults of the inter-block circuit 3E and the inter-block circuit 3F can be detected without synchronizing the clocks of the inter-block circuit 3E and the inter-block circuit 3F.

Depending on the product request, some of the transmitting-side hierarchical blocks connected to a common receiving-side hierarchical block, e.g., hierarchical block 4F, may not be used. In this case, the scan test of the hierarchical block 4F is not required. Normally, even if the output signal of the hierarchical block 4F which is not used is fixed, if failure of the inter-block circuit 3F occurs, it is possible that the correct operation cannot be performed in the normal operation of the hierarchical block 2 as the receiving-side hierarchical block. Therefore, the scan test of the hierarchical blocks 4F is not necessary, but the failure of the path including the inter-block circuit 3F needs to be detected. Therefore, it is useful to be able to detect a failure of an inter-block circuit between hierarchical blocks by the scan test of the receiving-side hierarchical block without clock synchronization with each other.

The above embodiments can be variously modified within a range not deviating from the gist thereof. For example, in fourth embodiment, the semiconductor device may include three or more receiving-side hierarchical blocks connected to one transmitting-side hierarchical block. In fifth embodiment, the semiconductor device may include three or more transmitting-side hierarchical blocks connected to one receiving-side hierarchical block. Further, in fourth or fifth embodiments, the configuration and operation of the receiving-side hierarchical block may be the same as the hierarchical block 2A of second embodiment. Also, in fourth or fifth embodiment, the configuration and operation of the transmitting-side hierarchical block may be the same as the hierarchical blocks 4A and 4B of second or third embodiments.

Although the invention made by the present inventor has been specifically described based on the embodiment, the present invention is not limited to the embodiment described above, and it is needless to say that various modifications can be made without departing from the gist thereof.

What is claimed is:

1. A semiconductor device comprising:
   a transmitting-side hierarchical block including a first logic circuit that realizes a first function and an output control circuit that controls an output signal of the transmitting-side hierarchical block;
   a receiving-side hierarchical block including a second logic circuit that performs scan test, realizes a second function and operates by receiving the output signal of the transmitting-side hierarchical block and a circuit under test of the scan test, and a test control circuit that controls the scan test of the second logic circuit; and
   an inter-block circuit connected between the transmitting-side hierarchical block and the receiving side hierarchical block and transmitting the output signal of the transmitting-side hierarchical block to the receiving-side hierarchical block,
   wherein the test control circuit controls the output control circuit so as to output a predetermined signal as the output signal of the transmitting-side hierarchical block regardless of the output signal of the first logic circuit when performing the scan test of the second logic circuit.

2. The semiconductor device according to claim 1, wherein the test control circuit performs the scan test of the second logic circuit after the output control circuit is controlled to output the predetermined signal.

3. The semiconductor device according to claim 1,
   wherein the test control circuit generates an inter-block circuit test control signal, and
   wherein the predetermined signal is generated based on the inter-block circuit test control signal.

4. The semiconductor device according to claim 3,
   wherein the test control circuit further generates a shut-off signal when performing the scan test of the second logic circuit, and
   wherein the output control circuit includes a shut-off circuit for shutting off the output signal of the first logic circuit based on the shut-off signal, and an output signal setting circuit for generating the predetermined signal based on the inter-block circuit test control signal.

5. The semiconductor device according to claim 4, wherein the transmitting-side hierarchical block further comprises an observation circuit that is connected to the first logic circuit and monitors the output signal of the first logic circuit.

6. The semiconductor device according to claim 5,
   wherein the transmitting-side hierarchical block further includes determination circuit that determinates shut-off function based on the output signal of the shut-off circuit and the output signal of the first logic circuit, and
   wherein the determination circuit outputs the output signal of the first logic circuit to the observation circuit when there is no failure in the shut-off circuit.

7. The semiconductor device according to claim 1,
   wherein the transmitting-side hierarchical block has a first test control circuit for controlling a scan test of the first logic circuit,
   wherein the first test control circuit, when the scan test of the first logic circuit is performed, controls the output control circuit so as to output a predetermined signal as the output signal of the transmitting-side hierarchical block regardless of the output signal of the first logic circuit, and
   wherein the output control circuit outputs the output signal of the first logic circuit as the output signal of the transmitting-side hierarchical block when the first and second logic circuits are both in normal operation.

8. The semiconductor device according to claim 1,
   wherein the receiving-side hierarchical block further includes an input control circuit connected between the inter-block circuit and the second logic circuit, and
   wherein the input control circuit receives a signal transmitted through the inter-block circuit, supplies the signal transmitted through the inter-block circuit to the second logic circuit when the second logic circuit is in normal operation, and generates an input signal to the second logic circuit based on the output signal of the output control circuit transmitted through the inter-block circuit when the scan test of the second logic circuit is performed.

9. The semiconductor device according to claim 8, wherein the input signal to the second logic circuit generated by the input control circuit when the scan test of the second logic circuit is performed toggles in synchronization with a scan test clock signal of the second logic circuit.

10. The semiconductor device according to claim 8,
    wherein the input control circuit, when the scan test of the second logic circuit is performed,
    if the output signal of the output control circuit transmitted through the inter-block circuit is a first signal, transmits the first signal to the second logic circuit as an input signal to the second logic circuit, and
    if the output signal of the output control circuit transmitted through the inter-block circuit is a second signal, generates a toggle signal in synchronization with a scan test clock signal of the second logic circuit as the input signal to the second logic circuit.

11. The semiconductor device according to claim 1,
    wherein a plurality of the receiving-side hierarchical blocks are provided, and
    wherein the transmitting-side hierarchical block has a plurality of output control circuits corresponding to the plurality of receiving-side hierarchical blocks, respectively.

12. The semiconductor device according to claim 1, further comprising a plurality of the transmitting-side hierarchical blocks,
    wherein the test control circuit of the receiving-side hierarchical block, when the scan test of the second logic circuit is performed, controls to output the predetermined signal to the output control circuits of the plurality of transmitting-side hierarchical blocks.

13. A scan test method of the semiconductor device according to claim 1, the scan test method comprising:
    outputting the predetermined signal as the output signal of the transmitting-side hierarchical block based on an instruction of the test control circuit; and
    performing the scan test of the second logic circuit in such a condition that the predetermined signal is output by the output control circuit.

14. A semiconductor device comprising:
    a transmitting-side hierarchical block including a first logic circuit, a first test control circuit, a first clock signal generation circuit and an output control circuit, the first logic circuit being a scan test target and realizing a first function, the first test control circuit controlling the scan test of the first logic circuit, the first clock signal generation circuit generating a first clock signal used for the scan test of the first logic circuit, and the output control circuit receiving an output signal of the first logic circuit;

a receiving-side hierarchical block including a second logic circuit, a second test control circuit and a second clock signal generation circuit, the second logic circuit being a scan test target and realizing a second function in response to the output signal of the transmitting-side hierarchical block, the second test control circuit controlling the scan test of the second logic circuit, and the second clock signal generation circuit generating a second clock signal used for the scan test of the second logic circuit; and an inter-block circuit provided between the transmitting-side hierarchical block and the receiving-side hierarchical block and transmitting the output signal of the transmitting-side hierarchical block to the receiving-side hierarchical block, wherein the output control circuit, when the scan test of the receiving-side hierarchical block is performed, is controlled by the second test control circuit and outputs a predetermined signal as an output signal of the transmitting-side hierarchical block without synchronizing with the first and the second clock signal.

15. The semiconductor device according to claim 14, wherein the second test control circuit performs the scan test of the second logic circuit in such a condition that the predetermined signal is supplied to the receiving-side hierarchical block via the inter-block circuit.

* * * * *